(12) United States Patent
Sotiriadis et al.

(10) Patent No.: US 7,400,276 B1
(45) Date of Patent: Jul. 15, 2008

(54) METHOD AND APPARATUS FOR REDUCING DELAY IN A BUS PROVIDED FROM PARALLEL, CAPACITIVELY COUPLED TRANSMISSION LINES

(75) Inventors: Paul P. Sotiriadis, Baltimore, MD (US); Anantha Chandrakasan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 611 days.

(21) Appl. No.: 10/351,811

(22) Filed: Jan. 27, 2003

Related U.S. Application Data

(60) Provisional application No. 60/352,632, filed on Jan. 28, 2002.

(51) Int. Cl.
  *H03M 7/00* (2006.01)
(52) U.S. Cl. .......................... 341/61; 341/50
(58) Field of Classification Search ............ 341/50, 341/61; 327/141
  See application file for complete search history.

(56) References Cited

U.S. PATENT DOCUMENTS

| | | | | |
|---|---|---|---|---|
| 3,639,900 | A | * | 2/1972 | Hinz, Jr. ............... 714/769 |
| 5,412,689 | A | * | 5/1995 | Chan et al. ............. 375/288 |
| 5,535,187 | A | * | 7/1996 | Melas et al. ............ 369/59.2 |
| 5,646,556 | A | * | 7/1997 | Longwell et al. ........ 326/93 |
| 5,880,981 | A | * | 3/1999 | Kojima et al. .......... 708/523 |
| 5,994,946 | A | * | 11/1999 | Zhang .................. 327/403 |
| 6,046,943 | A | * | 4/2000 | Walker ................ 365/189.05 |
| 6,140,850 | A | * | 10/2000 | Inoue .................. 327/141 |
| 6,289,490 | B1 | * | 9/2001 | Boyd et al. ............ 716/2 |
| 6,442,628 | B1 | * | 8/2002 | Bastiani et al. ........ 710/60 |
| 6,580,538 | B1 | * | 6/2003 | Kartalopoulos ......... 398/79 |
| 6,832,277 | B2 | * | 12/2004 | Durham et al. ......... 710/100 |
| 7,116,126 | B2 | * | 10/2006 | Tomsio et al. ......... 326/26 |

OTHER PUBLICATIONS

Ramprasad, S.; Shanbhag, N.R.; Hajj, I.N. "Information-theoretic bounds on average signal transition activity [VLSI systems]". Very Large Scale Integration (VLSI) Systems, IEEE Transactions on. vol. 7, Issue 3, Sep. 1999 pp. 359-368.*

Benini, L.; De Micheli, G.; Macii, E.; Poncino, M.; Quer, S. "Power optimization of core-based systems by address bus encoding". Very Large Scale Integration (VLSI) Systems, IEEE Transactions on. vol. 6, Issue 4, Dec. 1998 pp. 554-562.*

Youngsoo Shin; Soo-Ik Chae; Kiyoung Choi. "Reduction of bus transitions with partial bus-invert coding". Electronics Letters. vol. 34, Issue 7, Apr. 2, 1998 pp. 642-643.*

(Continued)

*Primary Examiner*—Jacques Louis Jacques
*Assistant Examiner*—Steven Nguyen
(74) *Attorney, Agent, or Firm*—Daly, Crowley, Mofford & Durkee, LLP

(57) ABSTRACT

A mechanism for use with a bus provided from parallel, capacitively-coupled bus lines to restrict a number of possible transitions on the bus to a number that is smaller than the maximum number of possible transitions so that data transmissions on the bus occur at a transmission rate which is higher than the transmission rate allowable if the number of transitions had not been restricted.

20 Claims, 10 Drawing Sheets

OTHER PUBLICATIONS

Youngsoo Shin; Soo-Ik Chae; Kiyoung Choi. "Partial bus-invert coding for power optimization of system level bus". Low Power Electronics and Design, 1998. Proceedings. 1998 International Symposium on. Aug. 10-12, 1998 pp. 127-129.*

Hirose, K.; Yasuura, H. "A bus delay reduction technique considering crosstalk". Design, Automation and Test in Europe Conference and Exhibition 2000. Proceedings. Mar. 27-30, 2000 pp. 441-445.*

Victor, B. and Keutzer, K. "Bus encoding to prevent crosstalk delay". Computer Aided Design, 2001. ICCAD 2001. IEEE/ACM International Conference on. Nov. 4-8, 2001 pp. 57-63.*

Victor et al. "Bus encoding to prevent crosstalk delay". IEEE/ACM International Conference on Computer Aided Design, 2001. Nov. 4-8, 2001 pp. 57-63.*

Anders et al.; "A Transition-Encoded Dynamic Bus Technique for High-Performance Interconnects;" 2002 Sumposium on VLSE Circuits Digest of Technical Papers; 0-7803-7310-3; 202 IEEE; pp. 16 and 17.

Sotiriadis et al.; "Transition Pattern Coding: An Approach to Reduce Energy in Interconnect;" date unknown.

Sotiriadis et al.; "Reducing Bus Delay in Sub-Micron Technology Using Coding;" IEEE Asia and South Pacific Design Automation Conference (ASP-DAC), 2001; pp. 109-114.

Sotiriadis et al.; "Bus Energy Reduction by Transition Pattern Coding Using a Detailed Deep Submicrometer Bus Model;" IEEE Transactions on Circuits and Systems •I: Fundamental Theory and Applications, vol. 50, No. 10, Oct. 2003: pp. 1280-1295.

Sotiriadis et al.: "Bus Enengy Minimization by Transition Pattern Coding (TPC) In Deep Sub-Micron Technologies;" IEEE/ACM International Converence on CAD (ICCAD), San Jose, 2000, pp. 322-327.

Sotiriadis et al.; "Transition Pattern Coding: An Approach to Reduce Energy in Interconnect;" 26th European Solid-State Circuit Conference (ESSERC); Stockholm, 2000, pp. 320-323.

Sotiriadis et al.; "Low Power Bus Coding Techniques Considering Inter-wire Capacitances;" IEEE Custom Integrated Circuits Conference 2000: pp. 507-510.

Paul Peter P. Sotiriadis, "Interconnect Modeling and Optimization In Deep Sub-Micron Technologies", Submitted to the Department of Electrical Engineering and Computer Science in partial fulfillment of the requirements for the degree of Doctor of Philosophy at the Massachusetts Institute of Technology, May 2002, 233 pages.

* cited by examiner

| $\dfrac{T_k(u^o,u^N)}{r_T \cdot C_L}$ | | | |
|---|---|---|---|
| LINE k-1 | LINE K | LINE k+1 | DELAY OF LINE k |
| $\Delta_{k-1}$ | $\Delta_k$ | $\Delta_{k+1}$ | $T_k/(r_T C_L)$ |
| — | — | — | 0 |
| — | — | ↑ | 0 |
| — | — | ↓ | 0 |
| ↑ | — | — | 0 |
| ↑ | — | ↑ | 0 |
| ↑ | — | ↓ | 0 |
| ↓ | — | — | 0 |
| ↓ | — | ↑ | 0 |
| ↓ | — | ↓ | 0 |
| ↑ | ↑ | ↑ | 1 |
| ↓ | ↓ | ↓ | 1 |
| — | ↑ | ↑ | $1+\lambda$ |
| — | ↓ | ↓ | $1+\lambda$ |
| ↑ | ↑ | — | $1+\lambda$ |
| ↓ | ↓ | — | $1+\lambda$ |
| — | ↑ | — | $1+2\lambda$ |
| — | ↓ | — | $1+2\lambda$ |
| ↑ | ↑ | ↓ | $1+2\lambda$ |
| ↑ | ↓ | ↓ | $1+2\lambda$ |
| ↓ | ↑ | ↑ | $1+2\lambda$ |
| ↓ | ↓ | ↑ | $1+2\lambda$ |
| — | ↑ | ↓ | $1+3\lambda$ |
| — | ↓ | ↑ | $1+3\lambda$ |
| ↑ | ↓ | — | $1+3\lambda$ |
| ↓ | ↑ | — | $1+3\lambda$ |
| ↑ | ↓ | ↑ | $1+4\lambda$ |
| ↓ | ↑ | ↓ | $1+4\lambda$ |

FIG. 4A

| $\dfrac{T_1(u^o, u^N)}{r_T \cdot C_L}$ | | |
|---|---|---|
| LINE 1 (m) | LINE 2 (m-1) | DELAY OF LINE 1 |
| $\Delta_1$ | $\Delta_2$ | $T_1/(r_r C_L)$ |
| – | – | 0 |
| – | ↑ | 0 |
| – | ↓ | 0 |
| ↑ | ↑ | 1 |
| ↓ | ↓ | 1 |
| ↑ | – | $1+\lambda$ |
| ↓ | – | $1+\lambda$ |
| ↑ | ↓ | $1+2\lambda$ |
| ↓ | ↑ | $1+2\lambda$ |

FIG. 4B

| DELAY CLASS OF $u^0 \rightarrow u^N$ | | $u^N$ | | | | | | | |
|---|---|---|---|---|---|---|---|---|---|
| | | 000 | 001 | 010 | 011 | 100 | 101 | 110 | 111 |
| $u^0$ | 000 | $D_{00}$ | $D_1$ | $D_2$ | $D_1$ | $D_1$ | $D_1$ | $D_1$ | $D_0$ |
| | 001 | $D_1$ | $D_{00}$ | $D_3$ | $D_2$ | $D_1$ | $D_1$ | $D_2$ | $D_1$ |
| | 010 | $D_2$ | $D_3$ | $D_{00}$ | $D_1$ | $D_3$ | $D_4$ | $D_1$ | $D_1$ |
| | 011 | $D_1$ | $D_2$ | $D_1$ | $D_{00}$ | $D_2$ | $D_3$ | $D_1$ | $D_1$ |
| | 100 | $D_1$ | $D_1$ | $D_3$ | $D_2$ | $D_{00}$ | $D_1$ | $D_2$ | $D_1$ |
| | 101 | $D_1$ | $D_1$ | $D_4$ | $D_3$ | $D_1$ | $D_{00}$ | $D_3$ | $D_2$ |
| | 110 | $D_1$ | $D_2$ | $D_1$ | $D_1$ | $D_2$ | $D_3$ | $D_{00}$ | $D_1$ |
| | 111 | $D_0$ | $D_1$ | $D_1$ | $D_1$ | $D_1$ | $D_2$ | $D_1$ | $D_{00}$ |

FIG. 5

| $u_O$ \ $u_N$ | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | . | . | . | . | . | . | . | . | . | . | . | . | . | . | . | . |
| 1 | . | . | X | . | . | . | . | . | . | X | . | . | . | . | . | . |
| 2 | . | X | . | . | X | X | . | . | . | X | . | . | X | X | . | . |
| 3 | . | . | . | . | X | X | . | . | . | . | . | . | . | X | . | . |
| 4 | . | . | X | X | . | . | . | . | X | X | X | X | . | . | . | . |
| 5 | . | . | X | X | . | . | X | . | X | X | X | X | . | . | X | . |
| 6 | . | . | . | . | . | X | . | . | . | . | X | X | . | X | . | . |
| 7 | . | . | . | . | . | . | . | . | . | . | X | X | . | . | . | . |
| 8 | . | . | . | . | X | X | . | . | . | . | . | . | . | . | . | . |
| 9 | . | . | X | . | X | X | . | . | . | . | X | . | . | . | . | . |
| A | . | X | . | . | X | X | X | X | . | X | . | . | X | X | . | . |
| B | . | . | . | . | X | X | X | X | . | . | . | . | X | X | . | . |
| C | . | . | X | . | . | . | . | . | . | . | X | X | . | . | . | . |
| D | . | . | X | X | . | . | X | . | . | . | X | X | . | . | X | . |
| E | . | . | . | . | . | X | . | . | . | . | . | . | . | X | . | . |
| F | . | . | . | . | . | . | . | . | . | . | . | . | . | . | . | . |

FIG. 6

| $\|\Delta_k\| + \lambda \| 2\Delta_k - \Delta_{k-1} - \Delta_{k+1}\|$ ||||
|---|---|---|---|
| LINES & TRANSITIONS ||| NORMALIZED, SAFE UPPER BOUND OF THE DELAY OF LINE k |
| k-1 | k | k+1 | |
| $\Delta_{k-1}$ | $\Delta_k$ | $\Delta_{k+1}$ | |
| − | − | − | 0 |
| − | − | ↑ | $\lambda$ |
| − | − | ↓ | $\lambda$ |
| ↑ | − | − | $\lambda$ |
| ↓ | − | − | $\lambda$ |
| ↓ | − | ↑ | 0 |
| ↑ | − | ↓ | 0 |
| ↑ | − | ↑ | $2\lambda$ |
| ↓ | − | ↓ | $2\lambda$ |
| ↑ | ↑ | ↑ | 1 |
| ↓ | ↓ | ↓ | 1 |
| − | ↑ | ↑ | $1+\lambda$ |
| − | ↓ | ↓ | $1+\lambda$ |
| ↑ | ↑ | − | $1+\lambda$ |
| ↓ | ↓ | − | $1+\lambda$ |
| − | ↑ | − | $1+2\lambda$ |
| − | ↓ | − | $1+2\lambda$ |
| ↑ | ↑ | ↓ | $1+2\lambda$ |
| ↓ | ↓ | ↑ | $1+2\lambda$ |
| ↑ | ↓ | ↓ | $1+2\lambda$ |
| ↓ | ↑ | ↑ | $1+2\lambda$ |
| − | ↑ | ↓ | $1+3\lambda$ |
| − | ↓ | ↑ | $1+3\lambda$ |
| ↑ | ↓ | − | $1+3\lambda$ |
| ↓ | ↑ | − | $1+3\lambda$ |
| ↑ | ↓ | ↑ | $1+4\lambda$ |
| ↓ | ↑ | ↓ | $1+4\lambda$ |

FIG. 7

METHOD AND APPARATUS FOR REDUCING DELAY IN A BUS PROVIDED FROM PARALLEL, CAPACITIVELY COUPLED TRANSMISSION LINES

CROSS REFERENCE TO RELATED APPLICATIONS

This application claims the benefit of U.S. Provisional Patent Application No. 60/352,632, filed Jan. 28, 2002, which is incorporated herein by reference in its entirety for all purposes.

STATEMENT REGARDING FEDERALLY SPONSORED RESEARCH

Not Applicable.

FIELD OF THE INVENTION

The present invention relates generally to transmission of data through buses.

BACKGROUND OF THE INVENTION

On-chip and inter-chip communications are realized by circuit devices called buses. A bus consists of parallel, aligned, similar wires that in most cases are on the same metal layer. Buses transmit units of information at a given fixed rate R (e.g., byte/sec). Some parallel buses are provided from parallel, capacitively-coupled transmission lines. The capacitive coupling introduces delay in the propagation of a signal from bus driver to bus receiver. Buses with capacitively-coupled lines have the property that the propagation time required for a signal depends upon the change (or transition) between the new data set to be transmitted on the lines and the last data set that was transmitted on the lines. Prior techniques estimate the delay associated with the capacitive coupling by modeling worst-case transitions. Typically, the rate R specified for such a bus is chosen to be sufficiently small to accommodate the delays associated with all the possible transitions.

To complicate matters further, the properties of the bus wires do not scale with technology in a favorable way. In modern technologies, in particular, deep sub-micron (DSM) technologies, there is increased capacitive coupling between the lines of buses due to the smaller distances between the lines as well as the higher aspect ratio (height/width) necessary to maintain a linear resistance of reasonable size.

SUMMARY OF THE INVENTION

In one aspect of the present invention, a method for use with a circuit having a bus provided from capacitively-coupled parallel lines includes restricting a number of possible transitions on the bus to a number that is smaller than the maximum number of possible transitions so that data transmissions on the bus occur at a transmission rate which is higher than the transmission rate allowable if the number of transitions had not been restricted.

In another aspect, an encoding method includes: (i) receiving a vector for transmission on a parallel bus; (ii) encoding the vector so that the encoded vector, when transmitted on the bus, requires only transitions belonging to a subset of a set of all possible transitions, the subset having a transition delay threshold that is less than a maximum transition delay associated with the set of all possible transitions; and (iii) providing the encoded vector to the bus for transmission.

In yet another aspect, an interconnect system includes a bus provided from capacitively-coupled parallel bus lines and a device, coupled to the bus, to restrict a number of possible transitions on the bus to a number that is smaller than the maximum number of possible transitions so that data transmissions on the bus occur at a transmission rate which is higher than the transmission rate allowable if the number of transitions had not been restricted.

In still yet another aspect, a circuit for use with a bus provided from capacitively-coupled parallel bus lines includes an encoder to encode a vector so that the encoded vector, when transmitted on the bus, requires only transitions belonging to a subset of a set of all possible transitions, the subset having a transition delay threshold that is less than a maximum transition delay associated with the set of all possible transitions, and a decoder to decode the encoded vector after transmission of the encoded vector has been completed.

Previous work in this area has presented models for delay assuming a distributed wire model or a lumped capacitive coupling between wires. Thus, delay estimates were based on a worst case assumption. In contrast, the techniques of the present invention take into account the effect of data patterns for a distributed model with distributed coupling component and an arbitrary number of lines driven by independent sources, thus allowing an estimation of the delay on a sample by sample basis. In particular, data being transmitted through the bus is encoded with the goal of eliminating certain types of transitions that require a large delay. With this particular mechanism, therefore, an increase in the communication speed though a bus provided from parallel, capacitively-coupled transmission lines can be achieved.

Other features and advantages of the invention will be apparent from the following detailed description, and from the claims.

BRIEF DESCRIPTION OF THE DRAWINGS

FIGS. 4A and 4B are tables showing delay functions and delays of intermediate bus lines (FIG. 4A) and boundary bus lines (FIG. 4B) of the bus modeled in FIG. 3.

FIG. 5 is a table showing an exemplary partitioning of bus transitions into classes based on transition delay ("delay classes") for a bus having three lines.

FIG. 6 is a table showing an exemplary restricted set of bus transitions for a bus having four lines.

FIG. 7 is a table showing delay functions and normalized, "safe" delays of intermediate bus lines.

DETAILED DESCRIPTION OF THE INVENTION

Figure 1:
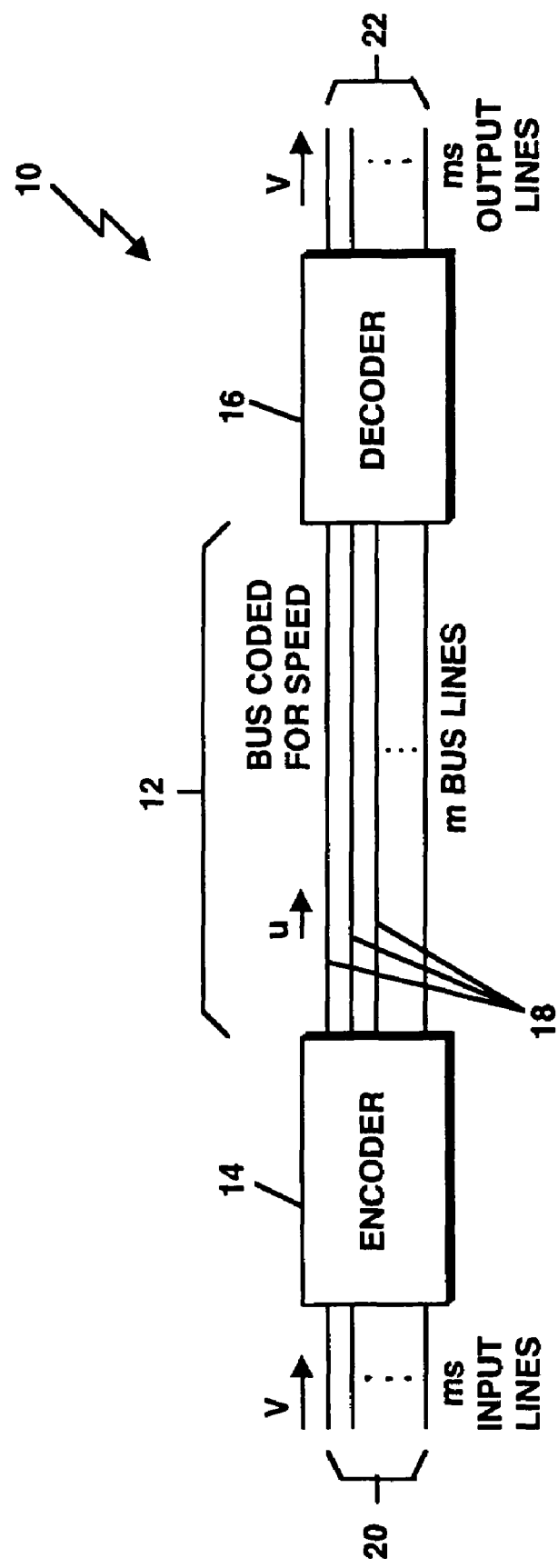
FIG. 1 is a simple block diagram of an interconnect system that includes a bus that transmits data coded for increased bus speed, and an encoder and decoder to encode and decode the data, respectively.

Referring to FIG. 1, an interconnect system or circuit 10 includes a bus 12 that is coupled to an encoder 14 at one end and a decoder 16 at the other end. The bus 12 includes "m" capacitively-coupled parallel bus lines 18. According to the invention, the bus 12 is "coded for speed". Coding for speed on the bus 12 recognizes that coupling between the lines causes different transitions to require different amounts of time to complete. The encoder 14 receives input data intended for transmission on the bus over input lines 20 and encodes the data for transmission on the bus. The decoder 16 decodes the transmitted data and provides the decoded data at output lines 22. The encoder 14 and decoder 16 are configured to operate according to a coding scheme in such a way as to allow only certain, faster transitions to take place on the bus 12, thus increasing the clock frequency of the bus 12. The combinatorial capacity of such a constrained bus is the theoretical maximum rate that data can be transmitted. While this rate is less than that of the bus without coding ("original bus"), it is possible to clock the constrained bus faster. In fact, the net data transmission speed can be significantly higher than that of the original bus. The increase of the effective speed of the bus is estimated as a function of the number of bus lines, the coupling between those lines and the subset of the set of transitions that are used. In the described embodiment, the bus 12 is a deep sub-micron bus ("DSM") used for on-chip interconnection. Alternatively, bus 12 could be an off-chip bus.

As will be described in further detail below, it is possible to estimate the functions of the delays of the signals in the lines of buses and study the properties of these functions. Such study reveals the interaction patterns among the lines causing delay. The interaction patterns can be used to classify the data transitions on the bus according to the time they require for completion. The coding scheme of the encoder 14 and decoder 16 is designed effectuate an increase in the speed with which the data is transmitted through the bus by restricting the transitions to those in a selected one or more of the classes.

In accordance with the present invention, therefore, techniques are used to increase the speed of the transmission of data through buses with capacitively coupled lines (for example, DSM) by restricting the possible transitions on the bus in a way that enables the bus to be operated at a higher clock rate. To compensate for the restriction of the possible transitions, coding must be applied to the original data. There are two opposite effects of this approach. First, the information rate is reduced since the number of possible transitions is reduced. Second, the actual rate is increased because of the increase of the transmission rate. With appropriate choice of coding, however, the total information rate can be increased significantly.

In general, assuming that a parallel bus with m lines is clocked with a clock period T, a vector of m bits is transmitted during every clock period T. There are $2^{m2}=2^m \times 2^m$ possible transitions of the bus. A transition is defined by a pair vectors, a first vector $u^0=[u^0_1, \ldots, u^0_m]^T$ of present data on the bus and the a second vector $u^N=[u^N_1, \ldots, u^N_m]^T$ of the next data to be transmitted through the bus. Every transition involving a vector pair requires a certain amount of time (referred to herein as the "transition delay") to get completed. The value of the transition delay is always less than or equal to T. The delays of all possible transitions of the bus can be determined using an electrical model of the bus, as will be described below. However, the transition delay can also be found in other ways, for example, it can be estimated using computer simulation, or measured experimentally. It will be appreciated that the maximum transition delay, that is, the maximum of the transition delays associated with all possible transitions, is required to be less than or equal to T to ensure that the data is correctly received at the other end of the bus.

Still referring to FIG. 1, in accordance with the invention, a subset S of the set of the all possible $2^{2m}$ transitions to occur on the bus 12 is selected to contain only those that have a delay less or equal to a predetermined delay threshold, $T_s$, where $T_s$ is less than T. The number of transitions that belong to the subset S depends on the value of the transition delay threshold, $T_s$ and therefore the bus speed increase to be achieved. By allowing only transitions within the subset S to occur in the bus, the clock of the bus 12 can be increased, or equivalently, the clocking period can be reduced from to T to $T_s$.

This implies that the information coded in the transitions of the subset S can travel $T/T_s$ times faster than would otherwise be possible without the coding. Since all transitions cannot be used, the amount of information transmitted during every clock cycle, say $m_s$ bits, is less than m bits, i.e., only $m_s/m$ of the total capacity per cycle can be achieved. An accurate definition of $m_s$ is $$m_s = \lim_{k \to \infty} 1/k \log_2 \{\# \text{ of sequences of length } k \text{ whose transitions belong to } S\}. \qquad \text{Eq. 1}$$

The net result is that, by imposing the above restriction, information can be transmitted $(T/T_s) \times (m_s/m)$ times faster than in the original "uncoded" bus.

Additionally, based on a simple electrical model of the bus and a mathematical estimation of the delays, the transitions can be grouped into classes ("delay classes") so that all transitions in a class have approximately equal delays.

Figure 8:
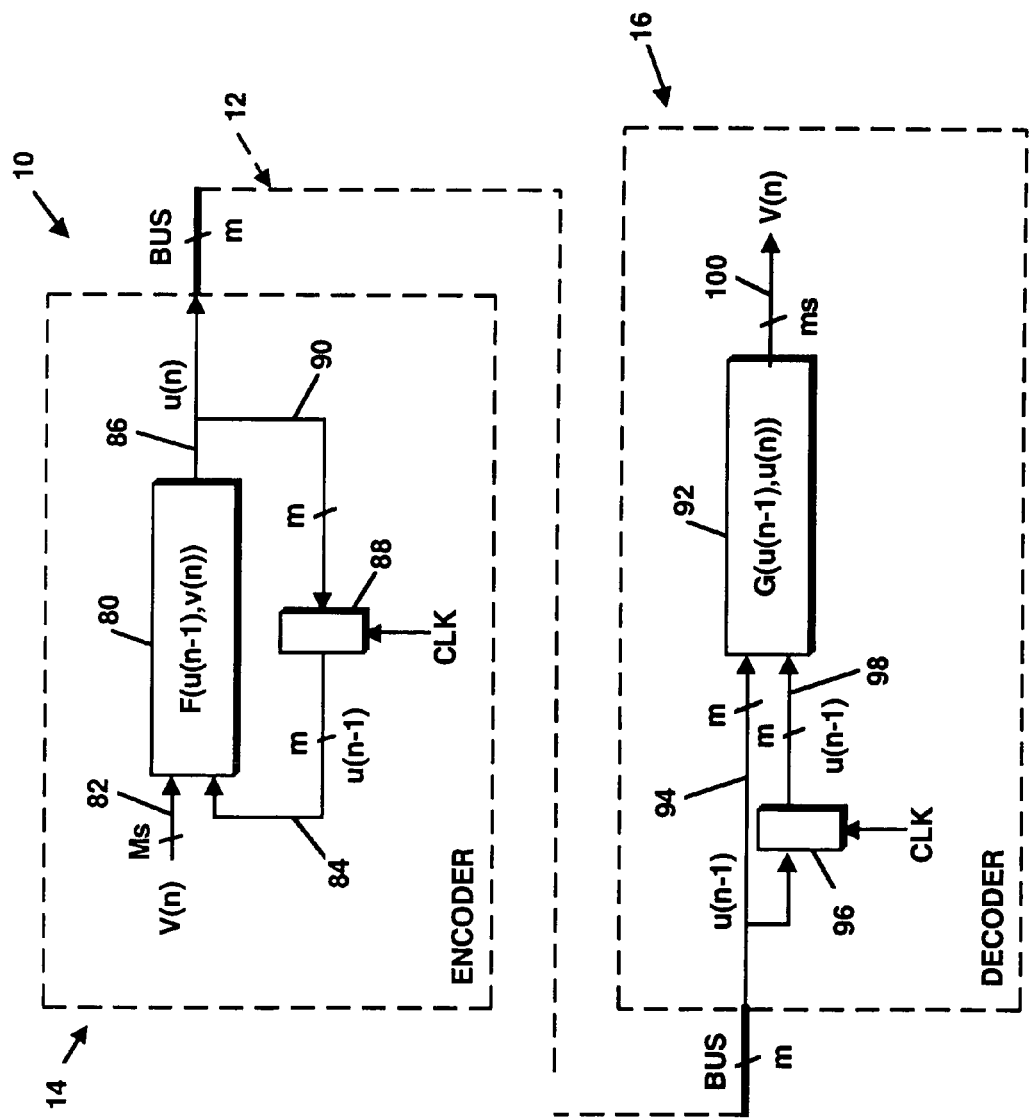
FIG. 8 is a block diagram of an exemplary embodiment of the encoder and decoder (from FIG. 1) configured as a Finite State Machine.

The encoder/decoder allow "unrestricted" sequences of data vectors to be transmitted through the bus while ensuring that the bus transitions always belong to the set S. The only requirement of the encoder/decoder is that it restrict the bus transitions to those in S. Several exemplary embodiments of the encoder/decoder are described later with reference to FIGS. 8 and 9.

Figure 2A:
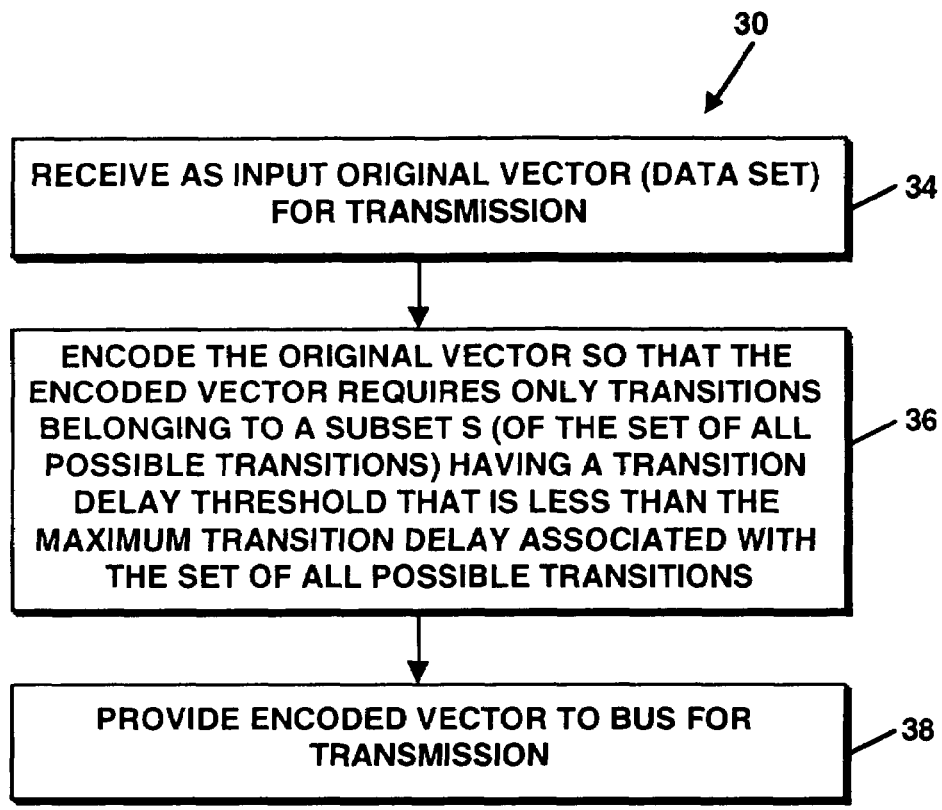
FIGS. 2A and 2B are flow diagrams depicting the operations of the encoder and decoder (from FIG. 1), respectively.
Figure 2B:
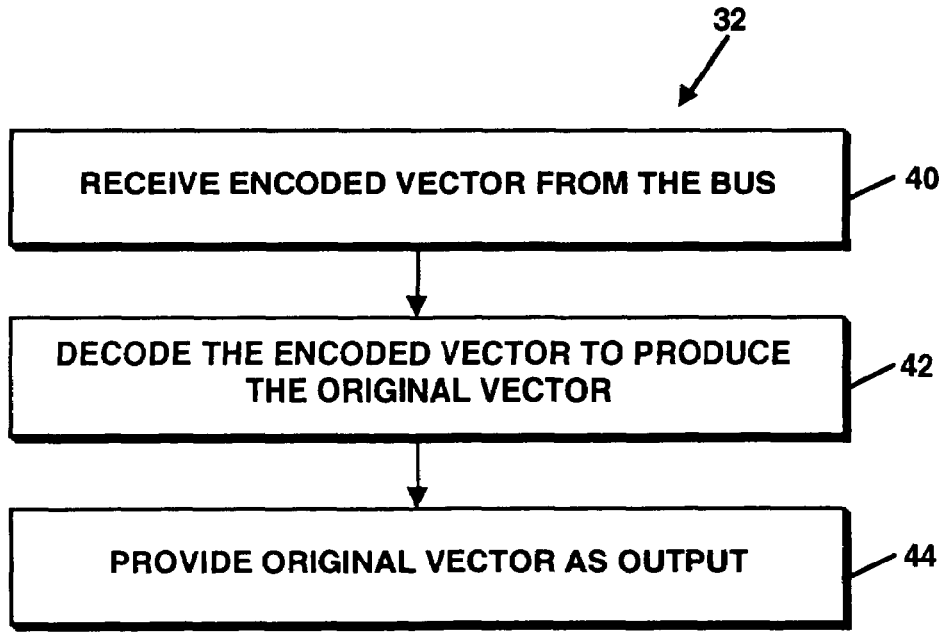

FIGS. 2A and 2B illustrate an encoding operation 30 of the encoder 14 and decoding operation 32 of the decoder 16, respectively, in accordance with the present invention. In particular, and referring to FIG. 2A, the encoder 14 receives as input a vector (or data set), referred to herein as the original vector v(k), on the input lines 20 (step 34), and provides an encoded vector u(k) from the original vector v(k). More specifically, the encoder 14 encodes the original vector so that the encoded vector requires only transitions belonging to a subset S (of the set of all possible transitions) having a transition delay threshold that is less than the transition delay associated with the set of all possible transitions (step 36). The encoder 14 provides the encoded vector to the bus 12 for transmission (step 38). Referring to FIG. 2B, the decoder 16 receives the encoded vector u(k) from the bus 12 (step 40), decodes it to produce the original vector v(k) (step 42) and provides the original vector v(k) as an output on the output lines 22 (step 44).

On one approach, the delay in the k-th line is a function $T_k(u^0, u^N)$ of the vectors $u^0$ and $u^N$. This approach allows a classification of the "old state-new state" transition patterns based on the delay functions. Such classification leads to the design of coding schemes that can accelerate the data transmission through the bus. It is assumed herein that the bus has lines and that the state (voltage) of the lines are given by the sequence of vectors:

$$u(n)=[u(n),u_2(n),\ldots,u_n(n)]^T \qquad \text{Eq. 2}$$

where $n=1,2,\ldots$ is the clock cycle of the bus. The time required by the bus to complete the transition is:

$$T(u(n),u(n+1))=\max T_k(u(n),u(n+1)) \qquad \text{Eq. 3}$$

where k is the index of the lines, $k=1,2,\ldots,m$, and the function $T_k$ is given approximately (Elmore delay) by:

$$T_k((u(n), u(n+1))/r_T^* C_L = (1+\lambda)\Delta_1^2 - \lambda\Delta_1\Delta_2, \qquad k=1$$
$$(1+2\lambda)\Delta_k^2 - \lambda\Delta_k(\Delta_{k-1}+\Delta_{k+1}), \quad 1<k<m$$
$$(1+\lambda)\Delta_m^2 - \lambda\Delta_m\Delta_{m-1}, \qquad k=m$$

Eq. 4 with $\Delta_i = u_i(n+1) - u_i(n)$.

Figure 3:
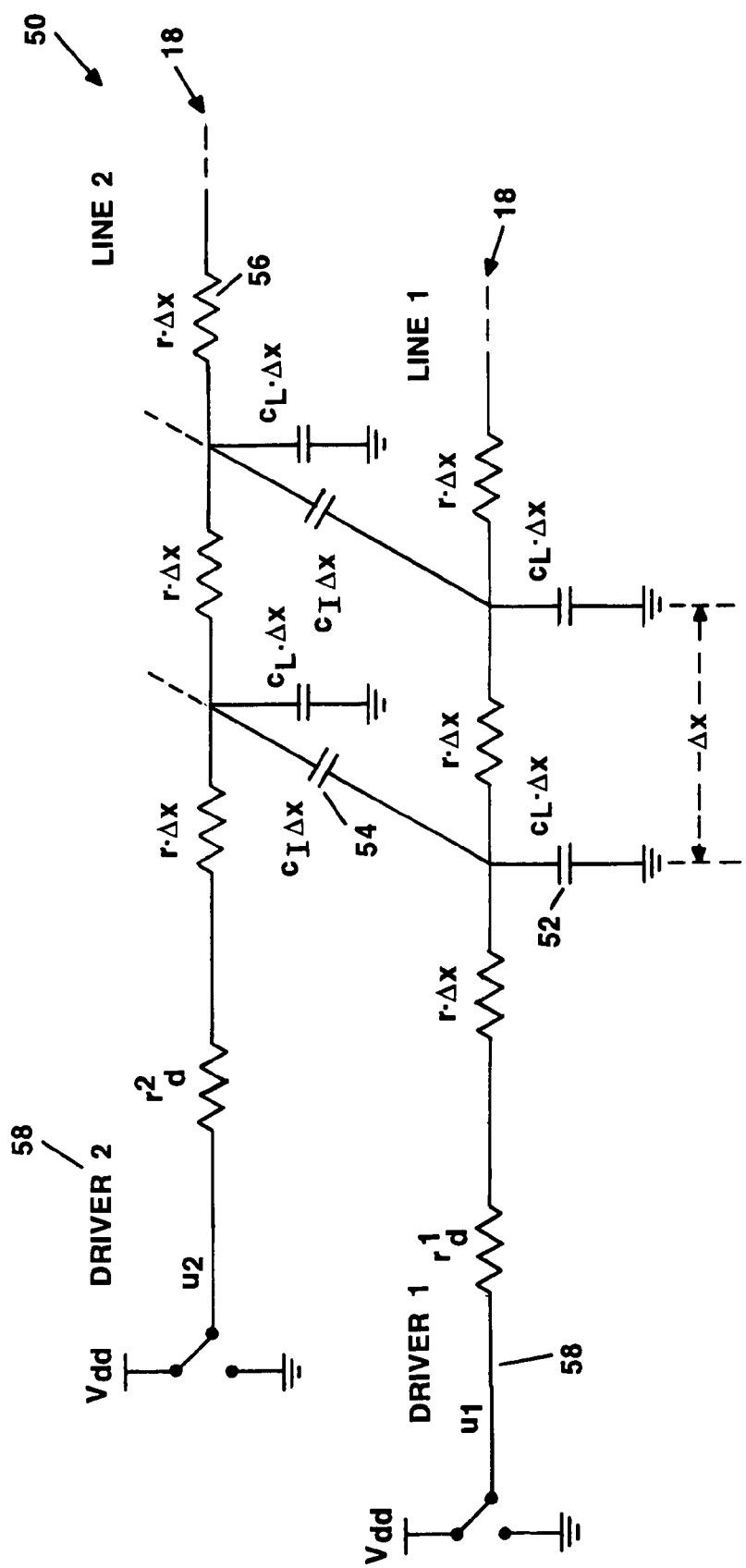
FIG. 3 is a schematic diagram showing an exemplary electrical model of the bus (from FIG. 1) including bus lines and drivers.

FIG. 3 shows an exemplary electrical model 50 for bus 12. The lines 18 are assumed capacitively coupled (distributed R-C), where line capacitance $C_L$ 52 is the parasitic capacitance per unit length between each line and ground, interwire capacitance $C_I$ 54 is the interwire capacitance per unit length between adjacent lines and resistance r 56 is the distributed series resistance of the lines per unit length. Line drivers 58 are modeled as voltage sources $u_i$ with series resistances $r_d^i$.

A commonly used approximate measure of the delay of the propagation of a step excitation through a linear system is the Elmore delay. For a system H(s) driven by a step input u(t) and producing an output y(t), the delay T is formally defined as the solution of the equation, $$\int_0^\infty (t-T)\frac{dy}{dt}dt = 0 \qquad \text{Eq. 5}$$

For the definition to be physically meaningful y(t) has to be increasing and its limit for $t\to\infty$ must exist. Elmore delay is used as a delay metric even in cases where the monotonicity condition doesn't hold. Assuming that $y(\infty)$ exists and it is different than $y(0)$, Eq. 5 implies that $$T = \frac{1}{y(\infty)-y(0)} \int_0^\infty t\frac{dy}{dt}dt \qquad \text{Eq. 6}$$

or in the Laplace domain, $$T = \frac{-1}{y(\infty)-y(0)} \cdot \frac{d}{ds}[sY(s)]\bigg|_{s=0} \qquad \text{Eq. 7}$$

Normalizing the supply voltage, $V_{dd}=1$, Eq. 7 becomes $$T = -[y(\infty)-y(0)] \cdot \frac{d}{ds}[sY(s)]\bigg|_{s=0} \qquad \text{Eq. 8}$$

In the case of the data bus there is more than one source exciting the network simultaneously. Moreover, since the data is random, the pattern of the driving voltages can be arbitrary. Consequently, there is a need for a more generalized definition of the delay. For simplification, it is assumed that the source voltages in FIG. 3 are steps of the form, $$u_k(t) = u_k^0 \text{ for } t<0 \text{ and} \qquad \text{Eq. 9}$$
$$= u_0^N \text{ for } t \geq 0$$

where $u_k^0, u_k^N \in \{0,1\}$ for all $k=1, 2, \ldots, m$. Now let $v(x,t) = [V_1(x,t), \ldots, V_m(x,t)]^T$ be the voltages of the lines at time t and at distance $x \in [0,L]$ from the drivers 58, where L is the physical length of the lines 18. For the voltages at the ends of the lines, $V_k(L,0)=u_k^0$, and in the limit as $t\to\infty$, $V_k(L,\infty)=u_k^N$. Since the lines of the bus are electrically coupled, the delay at every line is a function of the initial and the final conditions $u^0$ and $u^N$ respectively. The delay function of the k-th line can be defined as $$T_k: \{0,1\}^m \times \{0,1\}^m \to [0,\infty] \qquad \text{Eq. 10}$$

such that, $$T_k(u^0,u^N)=-(u_k^N-u_k^0)d/ds[sV_k[L,s)]|_{s=0} \qquad \text{Eq. 11}$$

As mentioned before, the lines of the bus are assumed distributed with uniformly distributed parasitic series resistance per unit length r, capacitance to ground per unit length $C_L$ and interwire parasitic capacitance per unit length $c_I$.

The transfer matrix techniques can be used to study the information theoretic limits of the possible increase in the data transmission rate of the bus. Using calculations as described in a paper by P. Sotiriadis and A. Chandrakasan entitled "Reducing Bus Delay in Submicron Techonology Using Coding," *IEEE Asia and South Pacific Design Automation Conf.*, 2001, pp. 109-114, the delay function $T_k$ for each k-th line is determined as $$T(u^0,u^N)=diag(u^N-u^0)R_T C_T(u^N-u^0) \qquad \text{Eq. 12}$$

where $R_T$ and $C_T$ are the total resistance and capacitance matrices of the circuit, respectively. If one assumed that the output resistances of all of the drivers are the same and independent of their logical outputs, then Eq. 12 can be simplified to $$T(u^0, u^N) = diag(u^N - u^0) C_T (u^N - u^0) r_T \quad \text{Eq. 13}$$

The mathematical analysis presented above that leads to the calculation of the delays can be directly extended to more complete/complicated models.

Following the assumption about the resistances of the drivers, Eq. 13 can be written more explicitly as $$\frac{T_k(u(n), u(n+1))}{r_T C_L} = (1+\lambda)\Delta_1^2 - \lambda \Delta_1 \Delta_2, \quad k=1 \quad \text{Eq. 14}$$

$$(1+2\lambda)\Delta_k^2 - \lambda \Delta_k (\Delta_{k-1} + \Delta_{k+1}), \quad 1 < k < m$$

$$(1+\lambda)\Delta_m^2 - \lambda \Delta_m \Delta_{m-1}, \quad 1 < k < m$$

where $\lambda = c_I/c_L$, $\Delta_k$ is the change of the voltage of the k-th line, i.e., with $\Delta_k = u_k(n+1) - u_k(n)$, and $C_L = L^* c_L$ is the total capacitance between a line and the ground.

Since $u_k(n+1)$, $u_k(n) \in \{0,1\}$, it is $\Delta_k \in \{-1, 0, 1\}$. FIG. 4A shows the delay in the k-th line as a function of $\Delta_{k-1}$, $\Delta_k$ and $\Delta_{k+1}$, where k=2, 3, . . . , m−1. The upward arrow is used for the case $\Delta_i = 1$, the downward arrow when $\Delta_i = -1$ and "−" when $\Delta_i = 0$. The possible normalized delay values $$\frac{T_k}{r_T C_L}$$

of an intermediate line are 0, 1, 1+λ, 1+2λ, 1+3λ and 1+4λ. Each of these values corresponds to a transition $[u^0_{k-1}, u^0_k, u^0_{k+1}] \rightarrow [u^N_{k-1}, u^N_k, U^N_{k+1}]$.

The results for the boundary lines are shown in FIG. 4B. Here the possible values of the normalized delays are 0, 1, 1+k and 1+2λ. Each of these values corresponds to a transition from $[u^0_1, u^0_2]$ to $[u^N_1, u^N_2]$ (or from $[u^0_m, u^0_{m-1}]$ to $[u^N_m, u^N_{m-1}]$). Transition delay classes $D_{00}, D_0, D_1, D_2, D_3$, and $D_4$ of transition patterns $u^0 \rightarrow u^N$ can be defined as, $$D_{00} = \{\text{all}(u^0, u^N) \text{ such that } T(u^0, u^N)/(r_T * C_L) = 0\}$$

$$D_r = \{\text{all}(u^0, u^N) \text{ such that } T(u^0, u^N)/(r_T * C_L) = 1 + r\lambda\}$$

for r=0, 1, 2, 3, 4 \quad \text{Eq. 15} where the function $T(u^0, u^N)$ is defined by Eq. 3. The transition patterns (given in the tables of FIGS. 4A-4B) that are associated with delay classes $D_{00}, D_0, D_1, D_2, D_3$ and $D_4$ are indicated by reference numerals 60, 62, 64, 66, 68 and 70, respectively.

For example, for a bus having 3 lines, i.e., $u^0, u^N \in \{0,1\}^3$, the delay pattern is the delay pattern shown in the table of FIG. 5.

In the traditional operation of data buses, the clock period $T_c$ is sufficiently large so that all the transitions in the bus have enough time to be completed. In other words, it must be that $$T_c \geq \eta^*(1+4\lambda) \quad \text{Eq. 16}$$

where η is a technology parameter. The analysis above suggests that a smaller $T_c$ could be used if time-expensive transitions were avoided. For example, if only transitions of the classes $D_{00}, D_0, D_1$ and $D_2$ were allowed, then the inequality of Eq. 16 could be replaced by the inequality of Eq. 17 below.

$$T_c \geq \eta^*(1+2\lambda) \quad \text{Eq. 17}$$

This means that for large values of λ the speed of the bus can almost double. Of course, eliminating some transitions automatically reduces the rate of information through the bus. For example, suppose that the bus has m=4 lines and TR2 is the set of all transitions that have normalized delay 0, 1, 1+λ or 1+2λ. The transitions in the set TR2 are in one of $D_{00}, D_0, D_1$ and $D_2$. The set TR2 is shown in the table of FIG. 6, where the dots stand for the allowed transitions and the x's stand for the forbidden ones.

Although TR2 does not have any regular pattern, all the possible transitions are allowed among the states 0,1,3,6,7,8, 9,12,14 and 15. If the set of states is reduced to {0,1,3,6,7,8, 9,12,14,15}, then the worst case delay is only 1+2λ. Thus, the number of bits that can be transmitted each time is decreased from four to $\log_2(10)$, which is about 3.3 bits. Also, the speed has been increased by a factor of $$\frac{1+4\lambda}{1+2\lambda}.$$

This ratio is about 1.85 in 0.18μ technology. On the other hand, the number of bits per transition has been decreased by a factor of 4/3.3, or approximately 1.21. Thus, the net result is about 1.53 times the initial data rate. The encoder and decoder needed for this example are very simple static maps. Should the set of states be further reduced to {0, 1,6,7,8,9,14,15}, then exactly 3 bits per transition (an integer number of bits) are possible. In the latter case, the encoding/decoding scheme is made trivial, and the net result is about 1.4 times the initial data rate.

The purpose of coding for speed is to increase the data transmission rate through buses, in particular, deep sub-micron buses. Coding for speed is not related to data compression, which is widely used to shorten the data size. On the contrary, coding for speed expands data by adding redundancy. In the modern deep sub-micron technologies, the lines are neither lumped nor decoupled. It is clear that the capacitive coupling influences directly the time needed for a transition of the lines to get completed. Moreover, the relative transitions of the lines strongly determine the completion time. For example, consider the cases of [ . . . , 0,0,0, . . . ]→ [ . . . , 1,1,1, . . . ] vs. [ . . . , 1,0,1, . . . ]→[ . . . , 0,1,0, . . . ]. In the first, the driver of the k-th line charges only $c_L$, while in the second transition charges $c_L + 4c_I$ because of the Miller effect.

Each line is considered individually, and the time required for the particular line to complete its transition is estimated as a function of the transitions of all lines in the bus. In this way, a transition time function is assigned to each of the lines. The transition time function of the whole bus is defined by taking the maximum of the values of the time functions of individual lines. Different transitions have different completion times. The variation may be large. Thus, it is desirable to first classify the transitions according to their delays and then to remove some of the "slow" transitions. What is obtained is a constrained channel. To eliminate the slower ones, it is necessary to decrease the number of bits transmitted each bus cycle. At the same time, however, the bus can be made to run faster by reducing the period of its synchronizing clock. Thus, while there are two opposite forces here, a net result is an increase in speed by a factor of more than 2 is possible.

The details of the estimation of the transition completion times and the classification of the transitions into their delay classes were described earlier.

For the purpose of introducing the notion of coding for speed, the Elmore approximation is sufficient and provides a relatively accurate classification of the transitions. To exploit all the power of coding for speed, an optimal solution would be to measure the performance of the bus.

There is an issue with Elmore approximation that needs to be considered. Referring again to FIGS. 4A-B, it can be seen that whenever a line does not transition its delay is zero. This might not always be true in reality. Consider a bus with 16 lines and suppose that λ is so large that the coupling to ground is relatively negligible. Also, suppose that all lines but line 8 change from 0 to 1, while line 8 maintains a logical value 0. It is clear that because of the coupling, the voltage of line 8 will exceed 50% $V_{dd}$ if the drivers have a very steep input. So, the delay of line 8 cannot be assumed zero. It will take some time until its voltage drops below 50% $V_{dd}$. The situation where lines 8 and 9 maintain a logical 0 is similar. A safe approach to the above issue is to modify Eq. 14 as:

$$\frac{T_k(u^0, u^N)}{r_T C_L} \leq (|\Delta_k| + \lambda|2\Delta_k - \Delta_{k-1} - \Delta_{k+1}|) \quad \text{Eq. 18}$$

with $\Delta_0 = \Delta_{m+1} = 0$. The modified delays are shown in the table of FIG. 7.

Note that the safe upper bound of the delay of individual lines, given by equation (18) and shown in FIG. 7, may change the estimated delay of the whole transition only from 1+λ to 2λ and only when a transition pattern . . . ↑↑-↑↑ . . . or . . . ↓↓-↓↓ . . . appears. Finally, the safe delay function $T_d^s$ on the set of the transitions of the bus using Eq. 18 instead of Eq. 14 is defined as:

$$T_d^s(u^0, u^N) = \max(|\Delta_k| + \lambda|2\Delta_k - \Delta_{k-1} - \Delta_{k+1}|) * r_T * C_L \quad \text{Eq. 19}$$

where k=1,2, . . . , m. The safe delay function of Eq. 19 can be used to define the delay classes $D_{00}, D_1, D_2, D_3$ and $D_4$ as:

$$D_{00} = \{\text{all}(u^0, u^N) \text{ such that } T_d^s(u^0, u^N) = 0\}$$

$$D_r = \{\text{all}(u^0, u^N) \text{ such that } T_d^s(u^0, u^N)/r_T * C_L = 1 + r\lambda\},$$
$$r = 0, 1, 2, 3, 4 \quad \text{Eq. 20}$$

By studying the timing properties of deep sub-micron buses, it can therefore be seen that different transitions of the bus require different amount of time to get completed. It is possible to exploit this property to accelerate the transmission of data. Coding the data to allow only fast transitions in the bus transforms the bus into a constrained discrete channel in the information theoretic sense.

For practical applications, it is possible to encode the data using a number of different coding schemes. For example, and referring to FIG. 8, the encoder 14 and decoder 16 can have a limited memory, in particular, when their "memory state" is identical to the vector of the bits last transmitted through the bus. Thus, the encoder 14, and decoder 16 can be implemented as a Finite State Machine, as shown. In this implementation, the encoder 14 includes a function 80 which receives an input codeword v(n) on first input lines 82 and current state data on second input lines 84, and generates from these inputs an output codeword u(n) on output lines 86. The codeword u(n) is provided to bus 12 as well as a memory element 88 (such as a register) via lines 90. Thus, in the next clock cycle, the current state data (the contents of memory element 88) are the codeword bits from the previous clock cycle, that is, codeword u(n−1). Note that the number $m_s$ of input lines 82 must be less than or equal to m. At the other end of bus 12, the decoder 16 receives codeword u(n) from the bus 12. The decoder 16 includes a function 92 that receives the codeword u(n) on first input lines 94 and current state data, that is, codeword u(n−1), via a memory element 96 on second input lines 98. The function 92 generates from this input data the original codeword v(n), which is provided on output lines 100.

Figure 9:
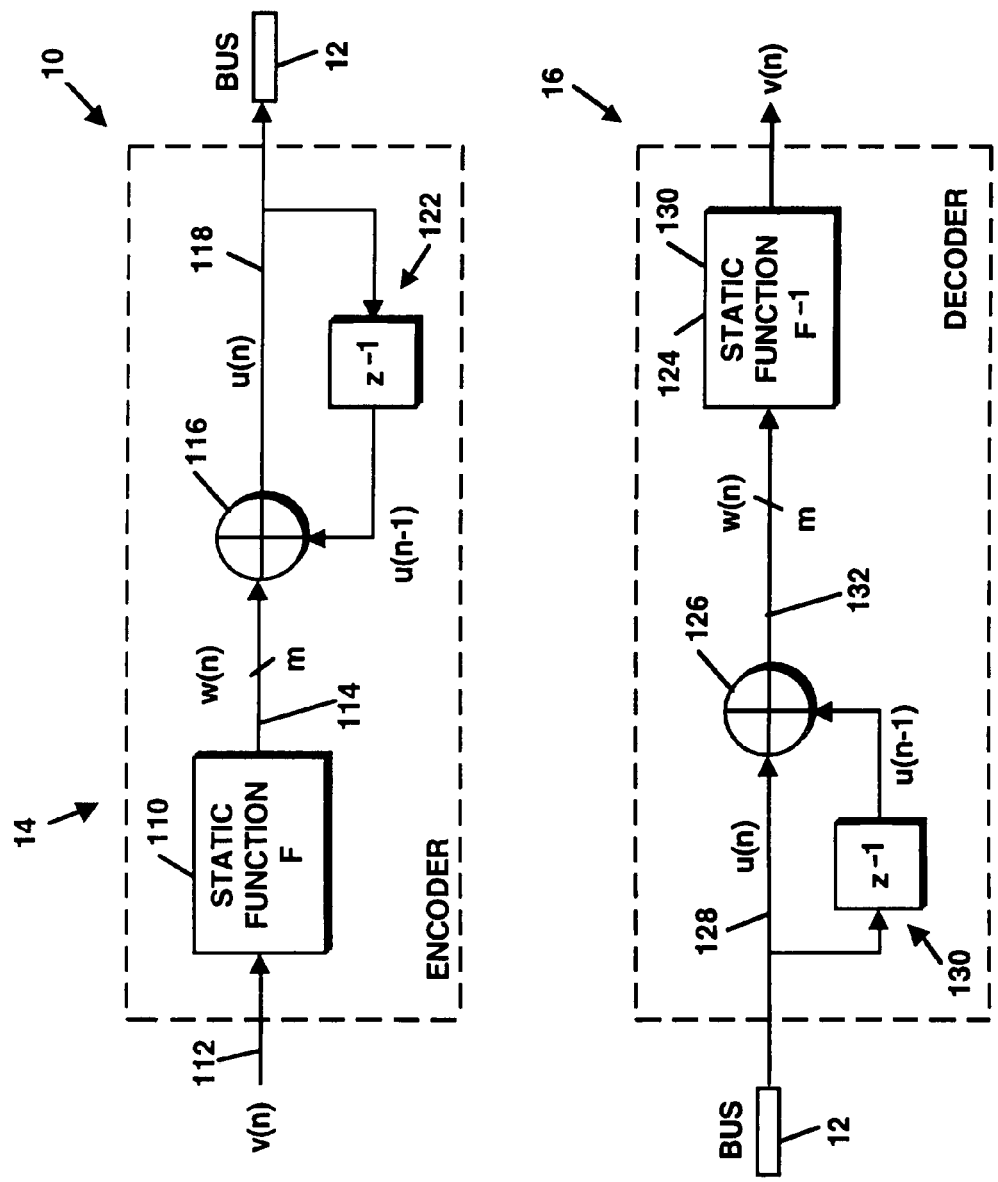
FIG. 9 is a block diagram of an alternative exemplary embodiment of the encoder and decoder (from FIG. 1) configured to implement a Differential RLL(1,∞) coding scheme.

Another practical coding solution can be achieved using Differential Run Length Limited (1,∞) or "DRLL" codes, as illustrated in the example of FIG. 9. The DRLL codes are in some sense two-dimensional. Their "spatial" dimension lies on the parallel transmission of bits through the lines of the bus. Run length limited codewords are used in the spatial dimension and simple binary differentiation takes place temporally. The result is a low complexity coding that can significantly increase the transmission speed.

The advantage in using the DRLL coding scheme is that the encoder 14 and decoder 16 are essentially combinational circuits, i.e., they require the implementation of only static functions. Thus, no memory is necessary. All that is needed is an Exclusive-OR (which is trivial). Thus, the complexity of encoder/decoder is very low compared to those of the most general schemes discussed above. Moreover, it can be shown that the use of this coding scheme reduces the power consumption of the bus as well.

Suppose that the transition is restricted to those pairs of vectors u(n)→u(n+1) such that no adjacent bits change values during the transition. That is, the vector resulting from the Exclusive-OR of u(n) and u(n+1) does not have adjacent ones. The set of such vectors in $\{0,1\}^m$ is called the set W. The vectors in W belong to the Run Length Limited 1-infinity code. Moreover, it is well known and straightforward to determine $$|W| = F_{m+1} \quad \text{Eq. 21}$$

where $F_m$ is the Fibonacci sequence.

Noting that if the XOR of u(n) and u(n+1) belongs in W, then $$T_k(u(n), u(n+1)) \leq \xi * (1 + 2\lambda) \quad \text{Eq. 22}$$

where set $\xi = r_T * C_L$. That it, all such transitions belong to TR2=$D_{00} \cup D_0 \cup D_1 \cup D_2$. It is easy to verify that inequality in Eq. 22 holds for every vector in W. Also, it may be noted that without any restriction (the uncoded case), it is (as given by Eqs. 14) that maximum of $(T_k) = \xi * (1 + 4\lambda)$. Therefore, if the pre-described restriction holds, then the bus can be run faster by the factor $(1+4\lambda)/(1+2\lambda)$.

A simple way to enforce the restriction discussed above (and no other restriction in the transition), is to use the coding scheme of XORing with RLL(1,inf). The scheme implies the relation $$u(n) = w(n) \oplus u(n-1). \quad \text{Eq. 23}$$

Suppose that the input vectors are restricted in the set W. Because of the relation of Eq. 23, there is the desired restriction $$u(n) \oplus u(n-1) \in W. \quad \text{Eq. 24}$$

Therefore, it is possible to transmit any of the $|W|=F_{M+1}$ codewords at each use of the bus. This implies a number of $$B = \log 2(F_{m+1}) \quad \text{Eq. 25}$$

bits each time. Of course, the value of B may not be integer. In this case, only [B] bits may be sent. A static map can be used to encode (statically) the [B] input data bits into [B] of the codewords in W. The "real" input data sequence is v(n). For every n, the vector v(n) contains B completely independent bits.

To calculate the increase in communication speed achieved using the coding, one must consider two factors. There are of course two opposing factors, that is, that the speed of the bus is increased by the factor $(1+4\lambda)/(1+2\lambda)$ and decreased by the factor m/B.

Thus, the speed is increased by the factor:

$$\Phi(m)=[(1+4\lambda)/(1+2\lambda)]*B/m. \quad \text{Eq. 26}$$

Consider a bus with m lines and let $S_M=\{0,1\}^m$ be the set of all m-bit binary vectors. As seen earlier, the time needed for a current vector to propagate through the bus depends on the current vector as well as on the vector transmitted just before the current vector. The propagation time of the current vector is a function of the transition from the previous vector to the current vector and can be approximated in the manner set forth above. Furthermore, the set of the transitions can be partitioned into the delay classes.

Still referring to FIG. 9, the encoder 14 includes a static function "F" 110 which receives input codeword v(n) on input lines 112 and provides a codeword w(n) on lines 114. The output codeword u(n) provided to the bus 12 is produced by XORing w(n) with the previous output codeword u(n−1). Thus, the encoder 14 includes an XOR circuit 116 which provides u(n) on output lines 118. The codeword u(n) is provided to bus 12 and is made available as an input to the XOR circuit 116 via a second signal path 122 for the next XOR computation that is to be performed. Coupled to the other end of the bus 12 is the decoder 16. The decoder 16 includes static function $F^{-1}$ 124 and an XOR circuit 126. The XOR circuit 126 receives u(n) on XOR input lines 128 and u(n−1) via a second signal path 130 and produces on XOR output lines 132 the codeword w(n). The static function 124 generates the original codeword v(n) from w(n) and provides v(n) on decoder output lines 134.

In operation, at time n=1,2, . . . , the m-bit vector u(n) is transmitted through the m-line bus 12. The vector w(n) equals F(v(n)). In the encoder 14, the function F(.) 110 maps the input data v(n) at time n to the codeword w(n). The bus acceleration factor depends on the properties of the transitions that result by the encoding. If the vector w(n)=(w1(n), w2(n), . . . , wn(n) does not have any two successive ones, then it can be seen that no line will experience normalized delay of more than (1+2λ) during the transition.

The coding for increasing the communication speed through deep sub-micron buses uses the classification of the transitions. The speed can be increased in some cases by more than 100% simply by removing some slow transitions. A classification of the transitions based on a more detailed delay estimation or measurement could result in even better possible performances. Also, the bounds that were developed can be tightened if one takes into account the particular structure of the transfer matrices. Although the above description focuses on only "synchronous" buses, in the sense that the clocking of the bus is fixed, it is possible to achieve much higher speeds for "asynchronous" buses, that is, if every transition is given the amount of time it needs to get completed and no more. In such a design, a control signal such as a "ready" signal would be needed.

The present invention provides many opportunities for practical implementations. Coding for speed is quite flexible in terms of circuit implementation. The complexity of the encoder/decoder is not critical in general. The results in net speed increase can be remarkable even with simple schemes like the Differential RLL 1. A 35% increase is easily achievable. Higher performances may require a more complicated coding scheme that has the form of a finite state machine, as discussed earlier. One practical challenge in coding for speed is the comparison between the original and the encoded buses in terms of clock speed. Another is to establish a measure of the complexity of circuit implementations of encoders/decoders and incorporate it into a total performance criterion. Regarding the coding for speed, it is desirable to derive new classes of efficient coding schemes with low complexity. As it was presented earlier, there is much room for further advances between the practically useful Differential RLL(1,∞) schemes and the ultimate limits.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the disclosed concepts. All publications and references cited herein are expressly incorporated herein by reference in their entirety.

What is claimed is:

1. A method for use with a circuit having a bus comprising m capacitively-coupled parallel bus lines where m is an integer greater than 1, the method comprising:

restricting a number of possible transitions on the bus to a number smaller than the maximum number of possible transitions, $2^{2m}$, by only including transitions each having a delay less than or equal to a predetermined delay threshold, $T_S$, so that data transmissions on the bus occur at a transmission rate which is higher than the transmission rate allowable if the number of transitions had not been restricted, where $T_S$ is greater than zero, wherein vectors of m bits are transmitted along the bus during every clock period, T, and a transition is associated with a vector pair having a first vector of present data, $u^0$, on the bus and a second vector of subsequent next data, $u^N$, to be transmitted on the bus, the first vector, $u^0$, includes $u^0_1, \ldots, u^0_m$ vector components each associated with a respective one of the m bits on a corresponding one of the m lines and the second vector, $u^N$, includes $u^N_1, \ldots, u^N_m$ vector components each associated with a respective one of the m bits to be transmitted on a corresponding one of the m lines, a transition comprises a transition from a logic state of each respective vector component of the first vector to a logic state of each respective corresponding vector component of the second vector where $T_S$ is less than T;

and an amount of information transmitted during a clock period equal to $T_s$, is equal to $m_s$ bits where $m_s$ is less than m so that information transmitted is transmitted at a rate which is $$\frac{T}{T_s} \times \frac{m_s}{m}$$

times faster than a rate which is possible when the number of possible transitions on the bus is not restricted.

2. The method of claim 1 wherein restricting comprises:
encoding data for transmission on the bus.

3. The method of claim 2 wherein encoding data comprises:
introducing redundancy into the data.

4. The method of claim 3 wherein the redundancy is selected to compensate for the restriction of the possible transitions on the bus.

5. The method of claim 3 wherein encoding data comprises encoding data using a Differential Run Length Limited (DRLL) coding scheme.

6. The method of claim 3 wherein encoding data comprises encoding data using a finite state machine encoder.

7. The method of claim 1 wherein the associated transition delays are derived from an electrical model of bus lines and bus drivers of the bus.

8. The method of claim 1 further comprising:
excluding from use transitions in one or more of classes of transitions, the classes of transitions each being associated with a worst-case transition delay for such class.

9. An encoding method comprising:
receiving a vector for transmission on a parallel bus comprising m capacitively-coupled parallel bus lines where m is an integer greater than 1;
encoding the vector so that the encoded vector, when transmitted on the bus, requires transitions belonging to a subset of a set of all possible transitions, $2^{2m}$, by only including transitions each having a delay less than or equal to a predetermined delay threshold, $T_S$, where $T_S$ is greater than zero; and
providing the encoded vector to the bus for transmission,
wherein vectors of m bits are transmitted along the bus during every clock period, T, and a transition is associated with a vector pair having a first vector of present data, $u^0$, on the bus and a second vector of subsequent next data, $u^N$, to be transmitted on the bus, the first vector, $u^0$, includes $u^0_1, \ldots, u^0_m$ vector components each associated with a respective one of the m bits on a corresponding one of the m lines and the second vector, $u^N$, includes $u^N_1, \ldots, u^N_m$ vector components each associated with a respective one of the m bits to be transmitted on a corresponding one of the m lines, a transition comprises a transition from a logic state of each respective vector component of the first vector to a logic state of each respective corresponding vector component of the second vector where $T_S$ is less than T; and
an amount of information transmitted during a clock period equal to $T_S$, is equal to $m_s$ bits where $m_s$ is less than in so that information transmitted is transmitted at a rate which is $$\frac{T}{T_s} \times \frac{m_s}{m}$$

times faster than a rate which is possible when the number of possible transitions on the bus is not restricted.

10. An interconnect system comprising:
a bus comprising m capacitively-coupled parallel bus lines where m is an integer greater than 1; and
a device, coupled to the bus, to restrict a number of possible transitions on the bus to a number smaller than the maximum number of possible transitions, $2^{2m}$, by only including those transitions each having a delay less than or equal to a predetermined delay threshold, $T_S$, so that data transmissions on the bus occur at a transmission rate which is higher than the transmission rate allowable if the number of transitions bad not been restricted, where $T_S$ is greater than zero, wherein vectors of m bits are transmitted along the bus during every clock period, T, and a transition is associated with a vector pair having a first vector of present data, $u^0$, on the bus and a second vector of subsequent next data, $u^N$, to be transmitted on the bus, the first vector, $u^0$, includes $u^0_1, \ldots, u^0_m$ vector components each associated with a respective one of the m bits on a corresponding one of the m lines and the second vector, $u^N$, includes $u^N_1, \ldots, u^N_m$ vector components each associated with a respective one of the m bits to be transmitted on a corresponding one of the m lines, a transition comprises a transition from a logic state of each respective vector component of the first vector to a logic state of each respective corresponding vector component of the second vector where $T_S$ is less than T; and
an amount of information transmitted during a clock period equal to $T_S$, is equal to $m_s$ bits where $m_s$ is less than m so that information transmitted is transmitted at a rate which is $$\frac{T}{T_s} \times \frac{m_s}{m}$$

times faster than a rate which is possible when the number of possible transitions on the bus is not restricted.

11. The interconnect system of claim 10 wherein the device comprises an encoder to encode data for transmission on the bus.

12. The interconnect system of claim 11 wherein the encoder comprises a Differential Run Length Limited (1,∞) encoder.

13. The interconnect system of claim 11 wherein the encoder comprises a Finite State Machine.

14. A circuit for use with a bus comprising m capacitively-coupled parallel bus lines, the circuit comprising:
an encoder to encode a vector so that the encoded vector, when transmitted on the bus, requires only transitions belonging to a subset of a set of all possible transitions, $2^{2m}$, the subset having a transition delay threshold, $T_s$, that is less than a maximum transition delay associated with the set of all possible transitions, where $T_S$ is greater than zero; and
a decoder to decode the encoded vector after transmission of the encoded vector has been completed,
wherein vectors of m bits are transmitted along the bus during every clock period, T, and a transition is associated with a vector pair having a first vector of present data, $u^0$, on the bus and a second vector of subsequent next data, $u^N$, to be transmitted on the bus, the first vector, $u^0$ includes $u^0_1, \ldots, u^0_m$ vector components each associated with a respective one of the m bits on a corresponding one of the m lines and the second vector, $u^N$, includes $u^N_1, \ldots, u^N_1$, vector components each associated with a respective one of the m bits to be transmitted on a corresponding one of the m lines, a transition comprises a transition from a logic state of each respective vector component of the first vector to a logic state of each respective corresponding vector component of the second vector where $T_S$ is less than T; and
an amount of information transmitted during a clock period equal to $T_s$, is equal to m, bits where $m_s$ is less than m so that information transmitted is transmitted at a rate which is $$\frac{T}{T_s} \times \frac{m_s}{m}$$

times faster than a rate which is possible when the number of possible transitions on the bus is not restricted.

15. The circuit of claim 14 wherein the encoder comprises a Differential Run Length Limited $(1,\infty)$ encoder.

16. The circuit of claim 11 wherein the encoder comprises a Finite State Machine.

17. The method of claim 1, further comprising reducing the clock period, T, to the predetermined delay threshold, $T_S$ so that $T=T_S$.

18. The method of claim 9, further comprising reducing the clock period, T, to the predetermined delay threshold, $T_S$ so that $T=T_S$.

19. A method for use with a circuit having a bus comprising m capacitively-coupled parallel bus lines where m is an integer greater than 1, the method comprising restricting a number of possible transitions on the bus to a number smaller than a maximum number of possible transitions, $2^{2m}$, wherein:

A method for use with a circuit having a bus comprising m capacitively-coupled parallel bus lines where m is an integer greater than 1, the method comprising restricting a number of possible transitions on the bus to a number smaller than a maximum number of possible transition $2^{2m}$, wherein:

(a) the restricting comprises including only those transitions with a delay value less than or equal to a predetermined delay threshold value, $T_S$ such that, in response to the restricting, data transmissions on the bus occur at a transmission rate which is higher than a transmission rate which would occur if the number of transitions had not been restricted;

(b) vectors of m bits are transmitted along the bus during each of a plurality of clock periods, T;

(c) a transition is associated with a vector pair wherein a first vector, $u^0$, of the vector pair corresponds to present data on the bus and a second vector, $u^N$, of the vector pair corresponds to subsequent next data to be transmitted on the bus, the first vector, $u^0$, includes $u^0_1, \ldots, u^0_m$ vector components each associated with a respective one of the m bits on a corresponding one of the m lines and the second vector, $u^N$, includes $u^N_1, \ldots, u^N_m$ vector components each associated with a respective one of the m bits to be transmitted on a corresponding one of the m lines;

(d) a transition corresponds to a transition from a logic state of each respective vector component of the first vector, $u^0$, to a logic state of each respective corresponding vector component of the second vector, $u^N$;

(e) the predetermined delay threshold value, $T_S$, is greater than zero and less than the clock period, T; and (f) an amount of information transmitted during a clock period equal to $T_S$, is equal to $m_s$ bits where $m_s$ is less than m so that information transmitted at a rate which is $$\frac{T}{T_s} \times \frac{m_s}{m}$$

times faster than a rate which is possible when the number of possible transitions on the bus is not restricted.

20. The method of claim 19 wherein:

restricting comprises encoding data for transmission on the bus;

encoding data comprises introducing redundancy into the data; and the redundancy is selected to compensate for the restriction of the possible transitions on the bus.

* * * * *

UNITED STATES PATENT AND TRADEMARK OFFICE
CERTIFICATE OF CORRECTION

PATENT NO.       : 7,400,276 B1
APPLICATION NO.  : 10/351811
DATED            : July 15, 2008
INVENTOR(S)      : Sotiriadis et al.

It is certified that error appears in the above-identified patent and that said Letters Patent is hereby corrected as shown below:

Col. 2, line 31, delete "though" and replace with -- through --.

Col. 3, line 63, delete "$2^{M2}$" and replace with -- $2^{2M}$ --.

Col. 3, line 66, delete "the a" and replace with -- a --.

Col. 4, line 27, delete "$m_S m$" and replace with -- $m_S/m$ --.

Col. 5, line 12, delete "…[u(n),…" and replace with -- [u,(n),… --.

Col. 7, line 37, delete ",1+K" and replace with -- , 1+$\lambda$ --.

Col. 7, line 45, delete "…,$u^N/(r_T$…" and replace with -- …,$u^N)/(r_T$… --.

Col. 7, line 60, delete "$T_c \geq\geq \eta * (1+4\lambda)$" and replace with -- $T_c \geq \eta * (1+4\lambda)$ --.

Col. 9, line 44, delete "amount" and replace with -- amounts --.

Col. 10, line 45, delete "can be run" and replace with -- can run --.

Col. 10, line 65, delete "be integer" and replace with -- be an integer --.

Col. 11, line 44, delete "(…, wn(n)" and replace with -- …, wn(n)), --.

Col. 12, line 17, delete "that that the" and replace with -- that the --.

Col. 13, line 44, delete "in" and replace with -- m --.

Col. 13, line 64, delete "bad" and replace with -- had --.

Col. 14, line 55, delete ", $u^N_1$," and replace with -- , $u^N m$ --.

Col. 14, line 65, delete "m," and replace with -- $m_S$ --.

UNITED STATES PATENT AND TRADEMARK OFFICE
CERTIFICATE OF CORRECTION

PATENT NO. : 7,400,276 B1
APPLICATION NO. : 10/351811
DATED : July 15, 2008
INVENTOR(S) : Sotiriadis et al.

It is certified that error appears in the above-identified patent and that said Letters Patent is hereby corrected as shown below:

Col. 15, line 27, delete "transition" and replace with -- transitions, --.

Signed and Sealed this

Eighteenth Day of November, 2008

JON W. DUDAS
*Director of the United States Patent and Trademark Office*